(12) United States Patent
Ichihashi

(10) Patent No.: US 12,246,394 B2
(45) Date of Patent: Mar. 11, 2025

(54) OPTICAL RESONATOR, AND LASER PROCESSING APPARATUS

(71) Applicant: Panasonic Intellectual Property Management Co., Ltd., Osaka (JP)

(72) Inventor: Kouki Ichihashi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 849 days.

(21) Appl. No.: 17/394,708

(22) Filed: Aug. 5, 2021

(65) Prior Publication Data

US 2021/0387282 A1 Dec. 16, 2021

Related U.S. Application Data

(63) Continuation of application No. PCT/JP2019/043012, filed on Nov. 1, 2019.

(30) Foreign Application Priority Data

Feb. 28, 2019 (JP) ................................ 2019-035769

(51) Int. Cl.
*B23K 26/064* (2014.01)
*G02B 27/10* (2006.01)
*H01S 5/14* (2006.01)

(52) U.S. Cl.
CPC ........ *B23K 26/064* (2015.10); *G02B 27/1006* (2013.01); *H01S 5/141* (2013.01)

(58) Field of Classification Search
CPC ... G02B 27/1006; H01S 5/141; H01S 5/0287; H01S 5/4068; H01S 5/4087; H01S 5/4062
See application file for complete search history.

(56) References Cited

U.S. PATENT DOCUMENTS

| 5,321,718 A | 6/1994 | Waarts et al. |
| 7,099,358 B1 * | 8/2006 | Chong ................ H01S 3/10 372/20 |

(Continued)

FOREIGN PATENT DOCUMENTS

| CA | 3030005 A1 * | 1/2018 | ......... G01N 15/1434 |
| CN | 105932545 | 9/2016 | |

(Continued)

OTHER PUBLICATIONS

Machine translation of WO 2018006559 A1 performed on Jun. 18, 2024, Zhang et al. (Year: 2018).*
English Translation of International Preliminary Report on Patentability issued Aug. 25, 2021 in corresponding International (PCT) Application No. PCT/JP2019/043012.
International Search Report issued Jan. 21, 2020 in International (PCT) Application No. PCT/JP2019/043012.

(Continued)

*Primary Examiner* — Dana Ross
*Assistant Examiner* — Kevin Guanhua Wen
(74) *Attorney, Agent, or Firm* — Wenderoth, Lind & Ponack, L.L.P.

(57) ABSTRACT

An optical resonator of wavelength beam combining type, includes: a laser diode array having a plurality of laser elements arranged along a predetermined direction and configured to emit light beams having wavelengths different from one another; a diffraction grating that diffracts the light beam emitted from each of the laser elements at a diffraction angle corresponding to the wavelength of the light beam; an output coupler that reflects a part of the light beam diffracted by the diffraction grating toward each of the laser elements; and an optical system provided between the laser diode array and the diffraction grating and configured to align the light beams emitted from the laser elements with one another; wherein the optical system includes a first lens element having a negative power only in the predetermined direction and a second lens element having a positive power only in the predetermined direction.

11 Claims, 9 Drawing Sheets

(56) References Cited

U.S. PATENT DOCUMENTS

| 2008/0253410 | A1 | 10/2008 | Sakurai et al. | |
|---|---|---|---|---|
| 2015/0331245 | A1* | 11/2015 | Tayebati et al. | G02B 27/10 |
| 2016/0161727 | A1* | 6/2016 | Chann | G02B 19/00 |
| 2017/0338118 | A1 | 11/2017 | Yoshida | |
| 2018/0095285 | A1* | 4/2018 | Dejima | G02B 27/10 |
| 2019/0214785 | A1 | 7/2019 | Zhang et al. | |

FOREIGN PATENT DOCUMENTS

| JP | 5-235453 | 9/1993 | |
|---|---|---|---|
| JP | 2008-260054 | 10/2008 | |
| JP | 2017-208445 | 11/2017 | |
| WO | WO-2018006559 A1 * | 1/2018 | G02B 27/0944 |

OTHER PUBLICATIONS

Second Office Action issued Sep. 18, 2023 in corresponding Chinese Patent Application No. 201980092063.5, with English language translation.

Notice of Reasons for Refusal issued Jun. 27, 2023 in corresponding Japanese Patent Application No. 2021-501555, with English machine translation.

Extended European Search Report issued Mar. 15, 2022 in European Application No. 19917149.7.

Klein, Sarah et al., "Suppression of cross coupling in an external resonator for a diode laser bar with 19 single emitters", Optics Letters, Feb. 2015, Optical Society of America, vol. 40, No. 4, pp. 641-644, XP001593985.

Office Action issued Mar. 1, 2023 in corresponding Chinese Patent Application No. 201980092063.5, with English translation.

* cited by examiner

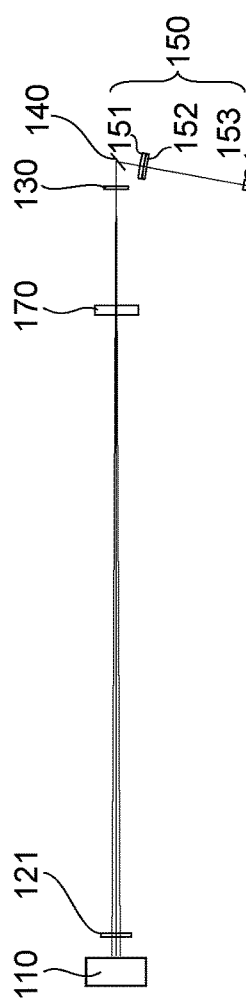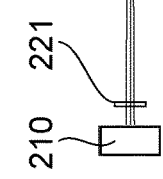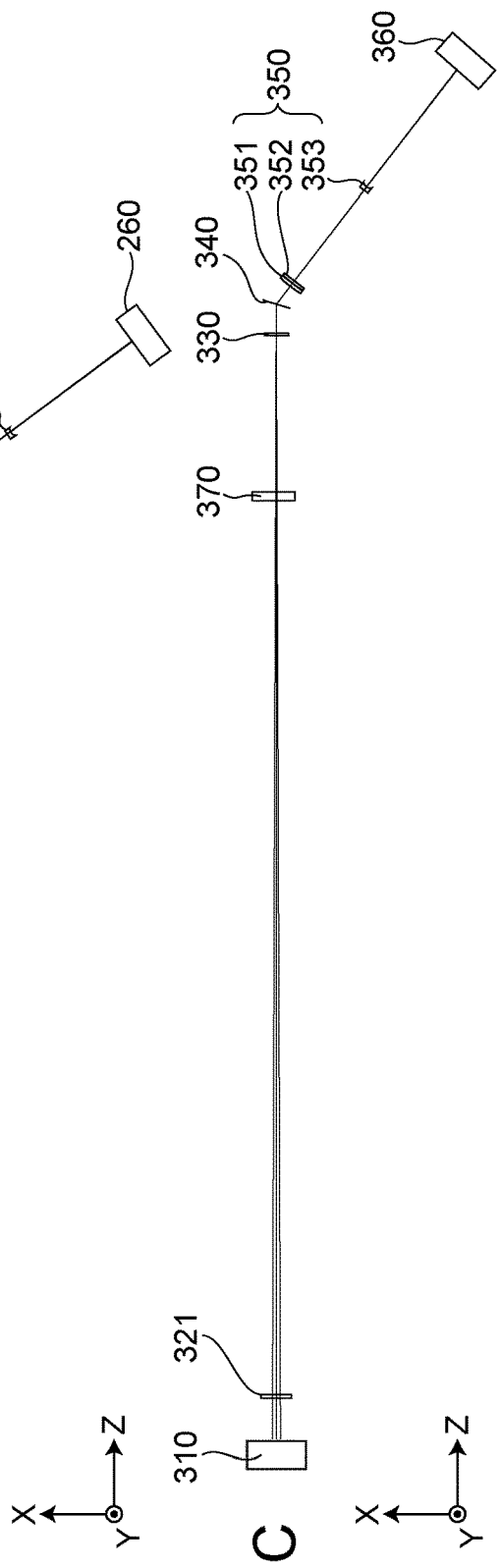

OPTICAL RESONATOR, AND LASER PROCESSING APPARATUS

CROSS-REFERENCE OF RELATED APPLICATIONS

This application is a continuation of International Patent Application No. PCT/JP2019/043012, filed on Nov. 1, 2019, which claims the benefit of Japanese Patent Application No. 2019-035769, filed on Feb. 28, 2019, the contents all of which are incorporated herein by reference.

TECHNICAL FIELD

The present disclosure relates to an optical resonator, and particularly to an optical resonator of wavelength beam combining type. The present disclosure also relates to a laser processing apparatus using such an optical resonator.

BACKGROUND

Patent Document 1 discloses an excimer laser apparatus with a tunable oscillation wavelength. The oscillation wavelength can be tuned by rotating a rotation stage having both a beam expander and a diffraction grating placed thereon around an entrance pupil plane of the beam expander.

PATENT DOCUMENT

[Patent Document 1] JP H5-235453 A

SUMMARY

The present disclosure provides an optical resonator which can be downsized even when a diffraction grating having a coarse pitch is used. The present disclosure also provides a laser processing apparatus using such an optical resonator.

The present disclosure relates to an optical resonator of wavelength beam combining type that combines a plurality of light beams having different wavelengths. The optical resonator includes a laser diode array having a plurality of laser elements arranged along a predetermined direction and configured to emit light beams having wavelengths different from one another. The optical resonator further includes a diffraction grating that diffracts the light beam emitted from each of the laser elements at a diffraction angle corresponding to the wavelength of the light beam. The optical resonator further includes an output coupler that reflects a part of the light beam diffracted by the diffraction grating toward each of the laser elements. The optical resonator further includes an optical system provided between the laser diode array and the diffraction grating and configured to align the light beams emitted from the laser elements with one another. The optical system includes, in a sequence from the laser diode array toward the diffraction grating, a first lens element having a negative power only in the predetermined direction and a second lens element having a positive power only in the predetermined direction.

Further, a laser processing apparatus according to the present disclosure includes the above-described optical resonator and a processing head that irradiates a workpiece with light beams output from the optical resonator.

According to the optical resonator of the present disclosure, the device can be downsized even when a diffraction grating having a coarse pitch is used.

BRIEF DESCRIPTION OF DRAWINGS

FIG. 11A is a configuration diagram illustrating an example of an optical resonator employing a diffraction grating with N=1600 rulings at the wavelength band of 900 nm, FIG. 11B is a configuration diagram illustrating an example of an optical resonator employing a diffraction grating with N=2220 rulings at the wavelength band of 400 nm, and FIG. 11C is a configuration diagram illustrating an example of an optical resonator employing a diffraction grating with N=1600 rulings at the wavelength band of 400 nm.

DESCRIPTION OF EMBODIMENT

Hereinafter, embodiments are described in detail with reference to the drawings as appropriate. However, unnecessarily detailed descriptions may be omitted. For example, detailed descriptions of well-known items or redundant descriptions of substantially the same configurations may be omitted. This is to prevent the following description from being unnecessarily redundant and to facilitate understanding by those skilled in the art.

It should be noted that the applicant provides the accompanying drawings and the following description for those skilled in the art to fully understand the present disclosure, and it is not intended to limit the subject matter described in the claims thereby.

First Embodiment

Hereinafter, a first embodiment of the present disclosure will be described with reference to FIGS. 1 to 12.

[1-1. Configuration]

Figure 1A:
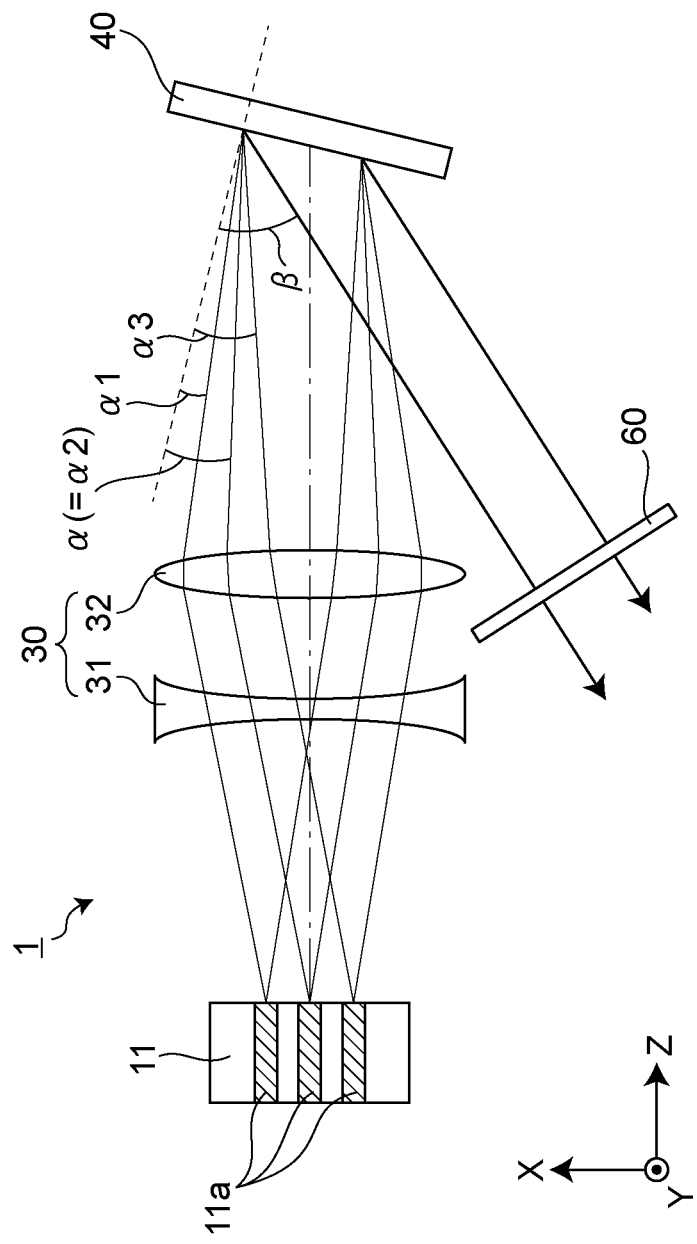
FIG. 1A is a configuration diagram illustrating a schematic configuration of an optical resonator according to a first embodiment.
Figure 1B:
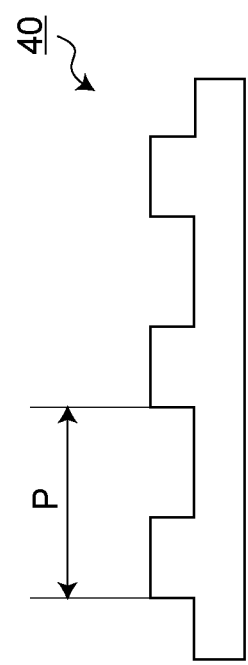
FIG. 1B is a cross-sectional view of a diffraction grating.

FIG. 1A is a configuration diagram illustrating a schematic configuration of an optical resonator 1 according to the first embodiment. FIG. 1B is a cross-sectional view of a diffraction grating.

The optical resonator 1 includes, along an optical axis direction, a laser diode array 11, an optical system 30, a diffraction grating 40, an output coupler 60, and the like. Here, for easy understanding, a traveling direction of light beams emitted from the laser diode array 11 is defined as a Z-direction, a direction perpendicular to the Z-direction and parallel to the paper plane is defined as an X-direction, and a direction perpendicular to the Z-direction and perpendicular to the paper plane is defined as a Y-direction.

The laser diode array 11 can be constituted of, for example, a direct diode laser (DDL), including a plurality of laser elements 11a arranged along a predetermined direction, for example, the X-direction in FIG. 1(A). The laser diode array 11 has, on the back end surface thereof, a high-reflectance coating with a reflectance of, for example, 99.9% or more. The laser diode array 11 has, on the front end surface thereof, an antireflection coating with a transmittance of, for example, 99.9% or more. Although FIG. 1A exemplifies three laser elements 11a, two or four or more laser elements 11a may be used. The laser elements 11a emit light beams having wavelengths different from each other based on optical resonance.

The optical system 30 is provided between the laser diode array 11 and the diffraction grating 40, including in a sequence from the laser diode array 11 toward the diffraction grating 40, a first cylindrical lens element 31 having a negative power only in the X-direction and a second cylindrical lens element 32 having a positive power only in the X-direction. The optical system 30 functions to align the light beams emitted from the respective laser elements 11a with each other in the X-direction and to collimate each light beam. A focal position of the optical system 30 may be set in a vicinity of a light output plane of the laser elements 11a. Note that term "collimating" means converting a single light beam into a parallel or substantially parallel beam and converting respective principal rays of a plurality of light beams into rays parallel or substantially parallel to each other.

The diffraction grating 40 diffracts the light beam emitted from each laser element 11a at a diffraction angle corresponding to its wavelength. Here, a reflective diffraction grating that reflects a light beam to an incident side is shown as an example of the diffraction grating 40. However, a transmissive diffraction grating that allows a light beam to pass therethrough to exit toward a side opposite to the incident side can be similarly used.

As illustrated in FIG. 1B, the diffraction grating 40 has a periodic structure with a pitch P, and may have a cross-section of rectangular waveform shape or alternatively, for example, a triangular waveform shape or a sawtooth shape. Generally, diffracted light is output in such a direction that a diffraction condition $\sin \alpha - \sin \beta = Nm\lambda$ is satisfied in terms of an incidence angle $\alpha$ and a diffraction angle $\beta$ with respect to a normal line of a diffraction grating, a diffraction order m, the number of rulings N (=1/pitch P), and a light wavelength $\lambda$. Here, the incidence angle $\alpha$ and the diffraction angle $\beta$ in a clockwise direction from a ray toward the normal line of the diffraction grating are assumed to have a positive sign. However, in case of such a reflective diffraction grating, the diffraction angle $\beta$ in a counterclockwise direction from the ray toward the normal line of the diffraction grating is assumed to have a positive sign.

The output coupler 60 can be constituted of a partially reflective mirror having a reflectance of, for example, 2%, for reflecting a part of the light beam diffracted by the diffraction grating 40 toward each of the laser elements 11a. This can supply feedback light for laser oscillation, allowing for occurrence of optical resonance between the back end surface of the laser diode array 11 and the output coupler 60. A light beam that has passed through the output coupler 60 is utilized for a subsequent process, for example, laser processing.

In the optical resonator of wavelength beam combining type according to the present disclosure, the incidence angle $\alpha$ on the diffraction grating 40 differs according to the wavelength of each light beam. However, the diffraction condition is set such that the diffraction angle $\beta$ in the diffraction grating 40 is identical to one another among the light beams. This allows for combining a plurality of light beams having different wavelengths in the same direction. Therefore, it is possible to add up maximum optical outputs of the respective laser elements 11a of the laser diode array 11, thereby achieving a high-output light beam.

Figure 2:
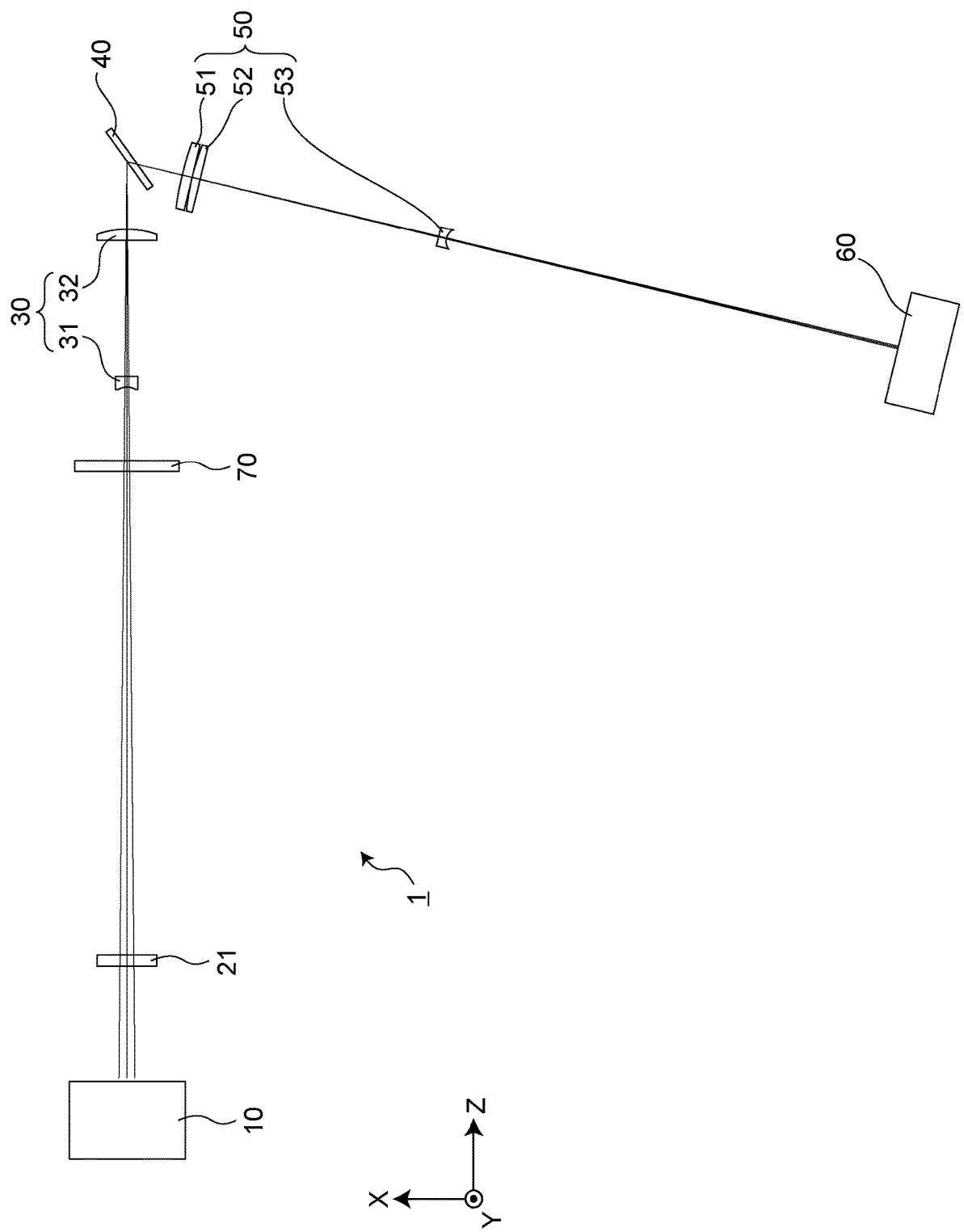
FIG. 2 is a configuration diagram illustrating an example of a specific configuration of the optical resonator according to the first embodiment.

FIG. 2 is a configuration diagram illustrating an example of a specific configuration of the optical resonator 1 according to the first embodiment. The optical resonator 1 includes, along the optical axis direction, a light source unit 10 including such a laser diode array 11 as shown in FIG. 1A, a slow axis collimator (SAC) 21, a half-wavelength plate 70, such an optical system 30 as shown in FIG. 1A, such an diffraction grating 40 as shown in FIG. 1A, a telescope optical system 50, such an output coupler 60 as shown in FIG. 1, and the like. Here, for easy understanding, exemplified is a case where the diffraction grating 40 is a transmissive diffraction grating, but a reflective diffraction grating may be used.

Figure 3:
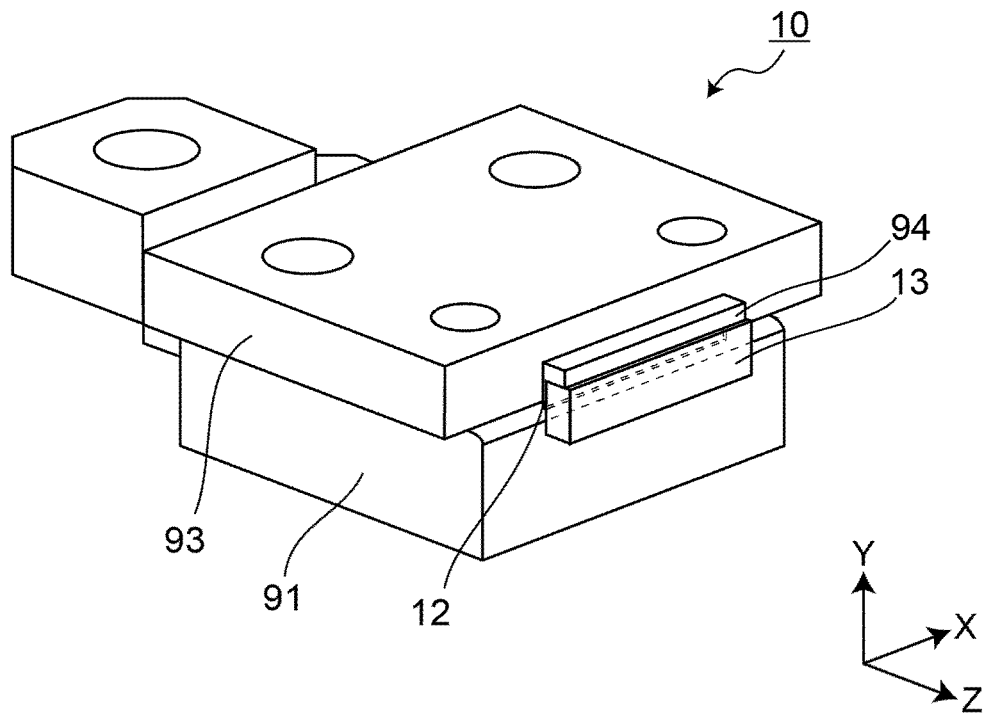
FIG. 3 is a perspective view of an example of a light source unit.
Figure 4:
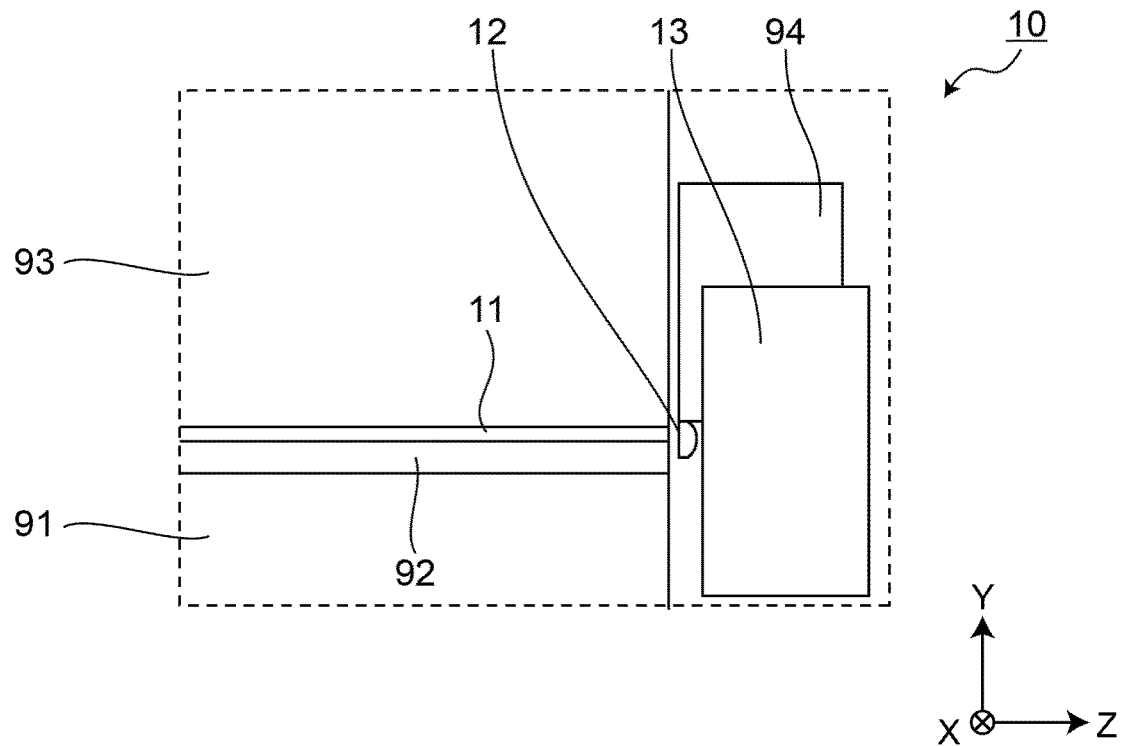
FIG. 4 is a partial side view of the example of the light source unit.

FIG. 3 is a perspective view of an example of the light source unit 10. FIG. 4 is a partial side view of the example of the light source unit 10. The light source unit 10 includes the above-described laser diode array 11, a fast axis collimator (FAC) 12, a beam twister (BT) 13, and the like.

The laser diode array 11 is mounted on a lower block 91 via a submount 92. An upper block 93 is placed over the laser diode array 11. The lower block 91 and the upper block 93 can function as electrodes for supplying electric current to the laser diode array 11 and also as heat sinks for dissipating heat generated from the laser diode array 11. The upper block 93 has a holder 94 fixed thereto, for holding the fast axis collimator 12 and the beam twister 13.

Figure 5:
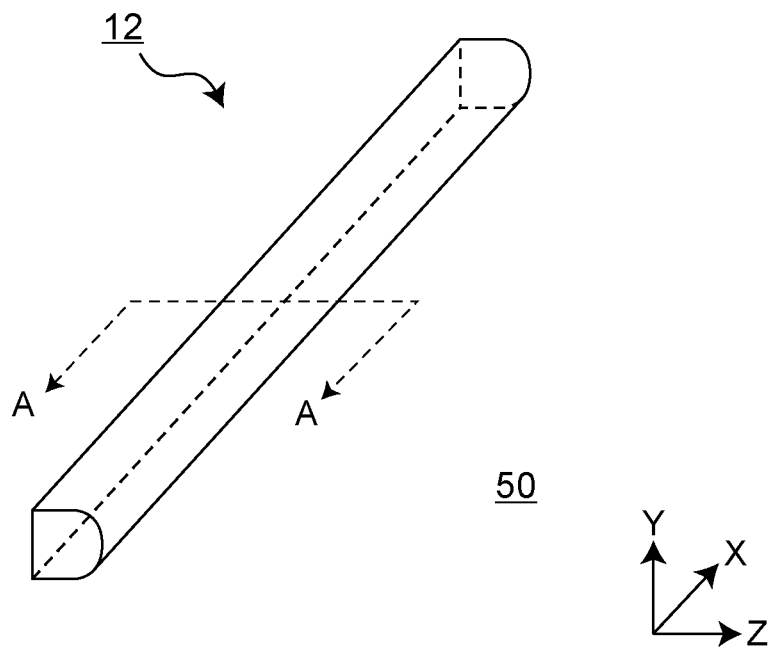
FIG. 5 is a perspective view of an example of a fast axis collimator.
Figure 6:
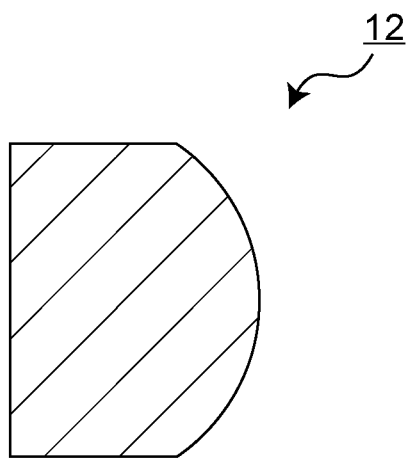
FIG. 6 is a cross-sectional view of the example of the fast axis collimator.

FIG. 5 is a perspective view of an example of the fast axis collimator 12. FIG. 6 is a cross-sectional view of the example of the fast axis collimator 12. The fast axis collimator 12 is constituted of a cylindrical lens having, for example, a plano-convex cross-section with a generatrix thereof extending in the X-direction.

The light beam emitted from each laser element 11a in the laser diode array 11 generally has an X-direction divergence angle $\Theta x$ being relatively small and a Y-direction divergence angle $\Theta y$ being relatively large ($\Theta x \ll \Theta y$). For this reason, with respect to the principal ray of the light beam, a direction in which the divergence angle is small is referred to as a slow direction, and a direction in which the divergence angle is large is referred to as a fast direction. The fast axis collimator 12 has an optical power only in the Y-direction and functions to collimate the light beam in the fast direction.

Figure 7:
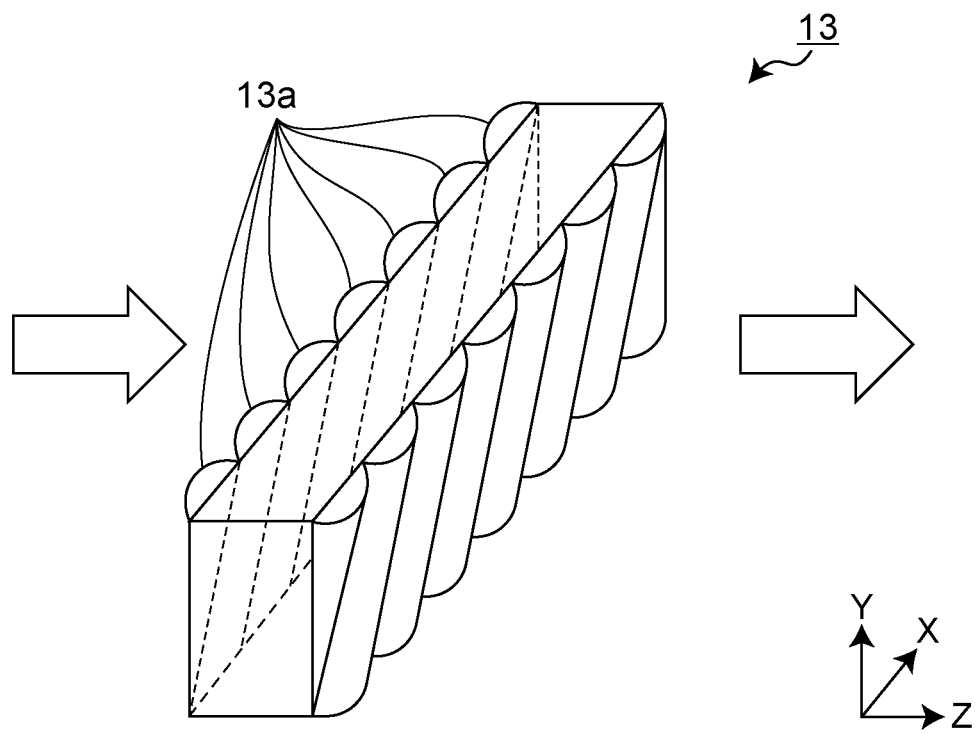
FIG. 7 is a perspective view of an example of a beam twister.
Figure 8:
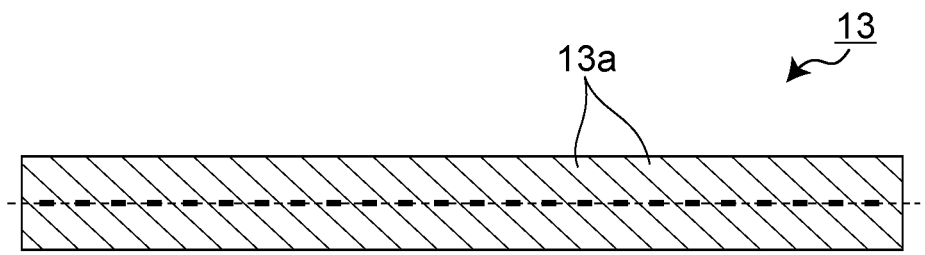
FIG. 8 shows an incidence plane of the beam twister.
Figure 9:
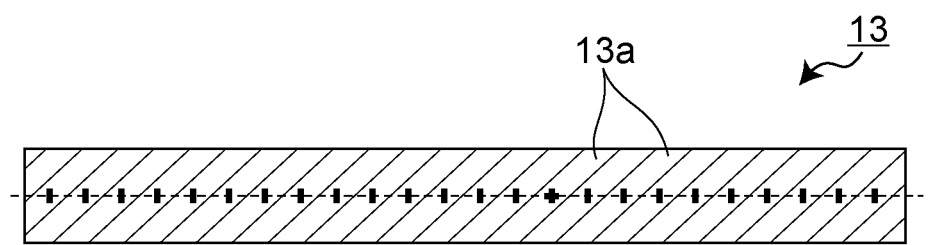
FIG. 9 shows an output plane of the beam twister.
Figure 10:
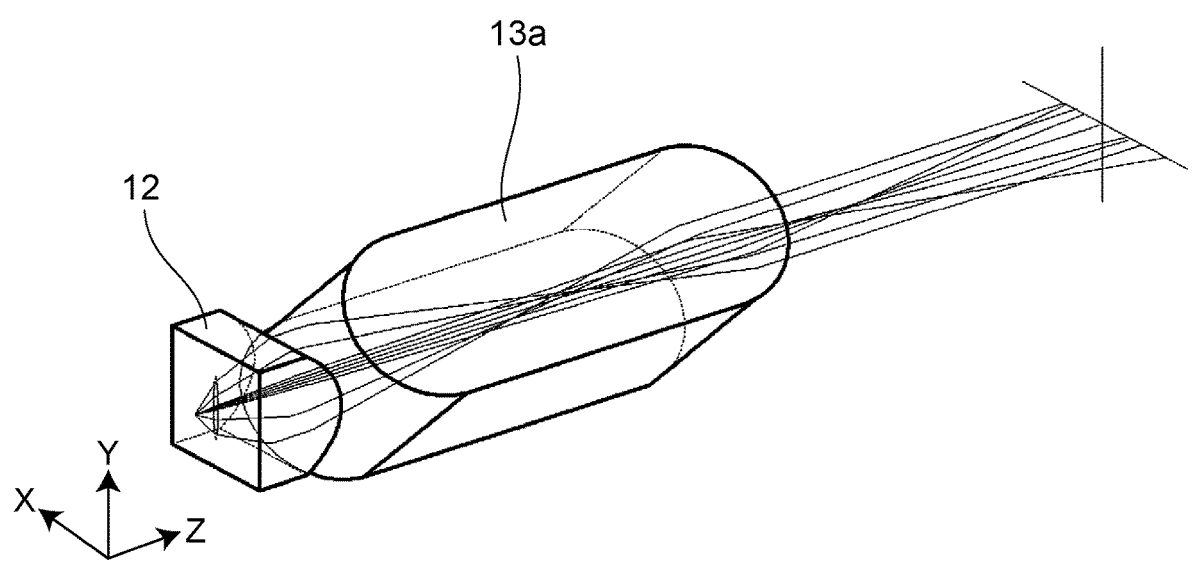
FIG. 10 is a perspective view illustrating a function of the beam twister.

FIG. 7 is a perspective view of an example of the beam twister 13. FIG. 8 shows an incidence plane of the beam twister 13. FIG. 9 shows an output plane of the beam twister 13. FIG. 10 is a perspective view illustrating a function of the beam twister 13.

The beam twister 13 is a rod-shaped optical element formed by stacking a plurality of cylindrical lenses 13a each having a biconvex shape on both sides and inclined at a predetermined angle, for example, 45 degrees, and then cutting the stack in parallel with the XZ-plane. An X-direction pitch of the cylindrical lenses 13a corresponds to an arrangement pitch of the laser elements 11a in the laser diode array 11.

As illustrated in FIG. 8, the light beam emitted from each laser element 11a has a horizontally long beam shape on the incidence plane of the beam twister 13 since the light beam is collimated only in the fast direction by the fast axis collimator 12.

Each cylindrical lens 13a rotates the light beam incident on the incidence plane by 90 degrees around the principal ray and outputs the light beam from the output plane. As illustrated in FIG. 9, the light beam has a vertically long beam shape on the output plane of the beam twister 13.

Thus, each cylindrical lens 13a functions to interchange the fast direction and the slow direction of the light beam. As a result, on the light source side of the beam twister 13, the fast direction of the light beam matches the Y-direction and the slow direction matches the X-direction. On the other hand, on the diffraction grating side of the beam twister 13, the fast direction of the light beam matches the X-direction and the slow direction matches the Y-direction. Note that the light beam has been already collimated in the fast direction by the fast axis collimator 12 but is spreading in the slow direction. When the fast axis collimator 12 and the beam twister 13 are disposed as in the present specific configuration, the focal position of the optical system 30 is set in a vicinity of the output plane of the beam twister 13.

Returning to FIG. 2, the slow axis collimator 21 collimates each of the light beams output from the beam twister 13 in the light source unit 10 in the slow direction. The slow axis collimator 21 may have a shape similar to that of FIG. 5, for example, and is constituted of a cylindrical lens having a plano-convex cross-section with a generatrix thereof extending in the X-direction.

The half-wavelength plate 70 functions to rotate polarization of the light beam by 90 degrees. For example, when the light beam is linearly polarized parallel to the X-direction, the light beam is converted to be linearly polarized parallel to the Y-direction.

As illustrated in FIG. 1A, the optical system 30 includes the first cylindrical lens element 31 having a negative power and the second cylindrical lens element 32 having a positive power.

The diffraction grating 40 diffracts each light beam at a diffraction angle corresponding to its wavelength.

The telescope optical system 50 includes cylindrical lens elements 51 and 52 each having a positive power in a direction parallel to the paper plane, and a cylindrical lens element 53 having a negative power in the direction parallel to the paper plane. The telescope optical system 50 functions to enlarge the light beam reflected from the output coupler 60 and reduce an angle of the principal ray of the light beam with respect to the optical axis, thereby reducing an angular error sensitivity of the output coupler 60 along the fast direction.

As illustrated in FIG. 1A, the output coupler 60 reflects a part of each of the light beams to supply the feedback light for laser oscillation.

[1-2. Operation]

Next, an operation of the optical resonator 1 according to the present embodiment will be described below. Hereinafter, a case will be described as an example where the three laser elements 11a are formed in the laser diode array 11.

As illustrated in FIG. 1A, the respective laser elements 11a are arranged at a predetermined pitch in the X-direction. When the light beam emitted from the laser element 11a arranged at a middle position is incident at an incidence angle $\alpha 2$ with respect to the normal line of the diffraction grating 40, the optical resonance occurs between the back end surface of the laser diode array 11 and the output coupler 60. In this case a resonance wavelength satisfying the diffraction condition is $\lambda 2$.

When the light beam emitted from the laser element 11a arranged at a +X side position is incident at an incidence angle $\alpha 1$ ($<\alpha 2$) with respect to the normal line of the diffraction grating 40, the optical resonance occurs between the back end surface of the laser diode array 11 and the output coupler 60. In this case a resonance wavelength satisfying the diffraction condition is $\lambda 1$ ($<\lambda 2$).

When the light beam emitted from the laser element 11a arranged at a −X side position is incident at an incidence angle $\alpha 3$ ($>\alpha 2$) with respect to the normal line of the diffraction grating 40, the optical resonance occurs between the back end surface of the laser diode array 11 and the output coupler 60. In this case a resonance wavelength satisfying the diffraction condition is $\lambda 3$ ($>\lambda 2$).

As a result, the light beams having a plurality of wavelengths $\lambda 1$, $\lambda 2$, and $\lambda 3$ can be combined in the same direction by separately satisfying the diffraction condition, and thus a high-output light beam can be achieved. Four or more light beams can likewise be combined in the same direction by separately satisfying the diffraction condition.

Next, how to modify the design of the optical resonator will be described below when the resonance wavelengths are changed. For specifications of the optical resonator, three examples of design will be described in a case where a ratio $\Delta\lambda/\Delta x$ of a pitch ($\Delta x$) of the laser elements 11a to a wavelength change ($\Delta\lambda$) corresponding thereto is constant. FIG. 11A is a configuration diagram illustrating an example of an optical resonator employing a diffraction grating with N=1600 rulings at the wavelength band of 900 nm. FIG. 11B is a configuration diagram illustrating an example of an optical resonator employing a diffraction grating with N=2220 rulings at the wavelength band of 400 nm. FIG. 11C is a configuration diagram illustrating an example of an optical resonator employing a diffraction grating with N=1600 rulings at the wavelength band of 400 nm. Note that the "wavelength band of 400 nm" means a wavelength of 400 nm to 499 nm, and the "wavelength band of 900 nm" means a wavelength of 900 nm to 999 nm.

The optical resonator illustrated in FIG. 11A includes a light source unit 110 that generates light beams at the wavelength band of 900 nm, a slow axis collimator 121, a half-wavelength plate 170, a single cylindrical lens 130 having a positive power only in the X-direction, a diffraction grating 140 with N=1600 rulings, a telescope optical system 150 including cylindrical lens elements 151, 152, and 153, an output coupler 160, and the like. As described above, the light source unit 110 includes a laser diode array, a fast axis collimator, a beam twister, and the like. $\Delta\lambda/\Delta x$ is set to $4\times 10^{-7}$. In this case, a dimension from the light source unit 110 to the diffraction grating 140 is about 1 m.

The optical resonator illustrated in FIG. 11B includes a light source unit 210 that generates light beams at the wavelength band of 400 nm shorter than those in the example of FIG. 11A, a slow axis collimator 221, a half-wavelength plate 270, a single cylindrical lens 230 having a positive power only in the X-direction, a diffraction grating 240 with N=2220 rulings, a telescope optical system 250 including cylindrical lens elements 251, 252, and 253, an output coupler 260, and the like. As described above, the light source unit 210 includes a laser diode array, a fast axis collimator, a beam twister, and the like. Also in this case, $\Delta\lambda/\Delta x$ is set to $4\times 10^{-7}$, and a dimension from the light source unit 210 to the diffraction grating 240 is about 1 m. However, the diffraction grating 240 has N=2220 rulings, which is extremely difficult to be manufactured by current technologies, resulting in an extremely low yield rate and a significantly increased cost.

The optical resonator illustrated in FIG. 11C includes a light source unit 310 that generates light beams at the wavelength band of 400 nm, which is the same as those in the example of FIG. 11B, a slow axis collimator 321, a half-wavelength plate 370, a single cylindrical lens 330 having positive power only in the X-direction, a diffraction grating 340 with N=1600 rulings, which is the same as that in the example of FIG. 11A, a telescope optical system 350 including cylindrical lens elements 351, 352, and 353, an output coupler 360, and the like. As described above, the light source unit 310 includes a laser diode array, a fast axis collimator, a beam twister, and the like. As in FIGS. 11A and 11B, $\Delta\lambda/\Delta x$ is set to $4\times10^{-7}$. In this case, a dimension from the light source unit 310 to the diffraction grating 340 is about 1.5 m. In other words, when the resonance wavelengths are shortened without changing the number of rulings N of the diffraction grating, it is necessary to increase the distance from the light source unit 310 to the diffraction grating 340 for satisfying the predetermined $\Delta\lambda/\Delta x$. Thus, the optical resonator inevitably becomes larger.

Next, a relationship between the pitch of the diffraction grating and the size of the device will be described below. As for the pitch $\Delta x$ of the laser elements 11a, a focal length f of the cylindrical lens 230, and a change $\Delta\alpha$ of the incidence angle $\alpha$ on the diffraction grating 140 corresponding to the position of the laser element 11a, the following expression (A1) is satisfied:

$$\Delta x = f \times \tan(\Delta\alpha) \approx f \Delta\alpha \quad (A1)$$

As for a reciprocal of an angular dispersion when the diffraction angle $\beta$ is constant, that is, for a change of the wavelength $\lambda$ with respect to the incidence angle $\alpha$, the following expression (A2) is satisfied in terms of the diffraction order m and the number of rulings N (=1/pitch P):

$$\Delta\lambda/\Delta\alpha = \cos(\alpha)/Nm \quad (A2)$$

From these expressions (A1) and (A2), the following expression (A3) is satisfied:

$$\Delta\lambda/\Delta\alpha \approx f\Delta\lambda/\Delta x \quad (A3)$$
$$\Delta\lambda/\Delta x \approx (1/f)\Delta\lambda/\Delta\alpha$$

Figure 12:
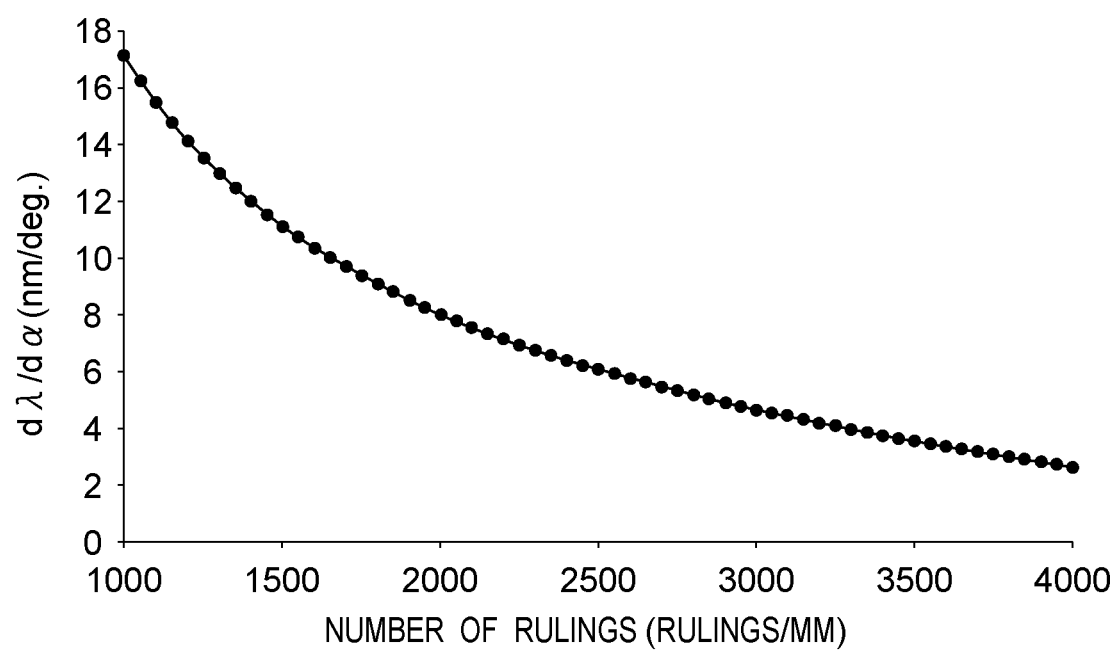
FIG. 12 is a graph illustrating a characteristic of $\Delta\lambda/\Delta\alpha$ versus a number of rulings of a diffraction grating in a case of $\alpha=-\beta$.

FIG. 12 is a graph illustrating a characteristic of $\Delta\lambda/\Delta\alpha$ versus the number of rulings when the diffraction grating satisfies $\alpha=-\beta$. The above-described condition is generally known as a condition under which a diffraction grating having high diffraction efficiency is easily realized. Also in the present embodiment, the diffraction grating is designed in the vicinity of this condition.

This graph shows that $\Delta\lambda/\Delta\alpha$ increases as the number of rulings decreases. Thus, when $\Delta\lambda/\Delta x$ is to be kept constant, the smaller the number of rulings is, the longer the focal length f is, according to the expression (A3). In other words, it can be seen that usage of a diffraction grating having a coarse pitch will increase the focal length f and the size of the resonator, for example, the distance from the laser diode array 11 to the cylindrical lens 230.

As a solution of this, according to the optical resonator of the present embodiment, as illustrated in FIGS. 1A and 2, the optical system 30 that aligns the light beams with one another in the X-direction includes the first cylindrical lens element 31 having the negative power only in the X-direction and the second cylindrical lens element 32 having the positive power only in the X-direction. This allows for increasing the focal length while reducing the size of the optical system 30. For example, a focal length of the optical system 30 can be set to be larger than the actual distance from the optical system 30 to the light source unit 10. Therefore, an optical resonator equivalent to the optical resonator illustrated in FIG. 11C can be downsized. For example, as in FIG. 11C, even when the diffraction grating 140 with N=1600 rulings is used for the light beams having the wavelength band of 400 nm, the dimension from the light source unit 310 to the diffraction grating 340 can be suppressed to the same extent as that in FIG. 11A.

[1-3. Effects, Etc.]

The present embodiment relates to the optical resonator 1 of wavelength beam combining type that combines a plurality of light beams having different wavelengths. The optical resonator 1 includes the laser diode array 11 having the plurality of laser elements 11a arranged along the predetermined X-direction and configured to emit light beams having wavelengths different from one another. The optical resonator 1 further includes the diffraction grating 40 that diffracts the light beam emitted from each of the laser elements 11a at the diffraction angle corresponding to the wavelength of the light beam. The optical resonator 1 further includes the output coupler 60 that reflects a part of the light beam diffracted by the diffraction grating 40 toward each of the laser elements 11a. The optical resonator 1 further includes the optical system 30 provided between the laser diode array 11 and the diffraction grating 40 and configured to align the light beams emitted from the laser elements 11a with one another. The optical system 30 includes, in a sequence from the laser diode array 11 toward the diffraction grating 40, the first lens element 31 having the negative power only in the predetermined X-direction and the second lens element 32 having the positive power only in the predetermined X-direction.

The above configuration allows for increasing the focal length of the optical system 30. Thus, the device can be downsized even when a diffraction grating having a coarse pitch is used. A diffraction grating having a coarser pitch can also be used without increasing the size of the device, resulting in increased degree of freedom in design of the optical resonator 1.

In the optical resonator 1 according to the present embodiment, the optical system 30 may have the focal length f longer than the distance between the laser diode array 11 and the second cylindrical lens element 32.

Thus, the optical resonator 1 can be downsized.

The optical resonator 1 according to the present embodiment may include, in a sequence from the laser diode array 11 toward the diffraction grating 40, the fast axis collimator 12 that collimates in the fast direction each of the light beams emitted from the respective laser elements 11a, the beam twister 13 that rotates each of the light beams output from the fast axis collimator 12 by 90 degrees around the principal ray thereof, and the slow axis collimator 21 that collimates in the slow direction each of the light beams output from the beam twister 13. The focal position of the optical system may be set in a vicinity of the output plane of the beam twister.

Thus, an array of high-quality light beams can be realized.

Second Embodiment

Hereinafter, a second embodiment of the present disclosure will be described with reference to FIG. 1.

An optical resonator according to the present embodiment has a configuration similar to that of the optical resonator 1 illustrated in FIG. 1A. Here, optimization of the optical system 30 will be described.

First, $d\lambda/d\alpha$ is a change of a resonance wavelength $\lambda$ with respect to a change of an incidence angle $\alpha$, which can be expressed by the following expression (1). Here, N is the number of rulings of the diffraction grating (a reciprocal of a pitch P), and m is a diffraction order.

[Mathematical Formula 1]

$$\frac{d\lambda}{d\alpha} = \sqrt{\left(\frac{1}{Nm}\right)^2 - \left(\frac{\lambda}{2}\right)^2} \quad (1)$$

Next, $d\lambda/dx$ is a change of the resonance wavelength $\lambda$ with respect to a pitch dx of the laser elements 11a, which can be expressed by the following expression (2). Here, f is a combined focal length of the optical system 30.

[Mathematical Formula 2]

$$\frac{d\lambda}{dx} = \frac{1}{f}\frac{d\lambda}{d\alpha} = \frac{1}{f}\sqrt{\left(\frac{1}{Nm}\right)^2 - \left(\frac{\lambda}{2}\right)^2} \quad (2)$$

A telephoto ratio t of the optical system 30 is expressed by the following expression (3). Here, D is a distance from an image-side principal plane of the second cylindrical lens element 32 having a positive power to a focal plane on an object side of the optical system (corresponding to the light output plane of the laser elements 11a), s is a distance from an object-side principal plane of the first cylindrical lens element 31 having a negative power to the image-side principal plane of the second cylindrical lens element 32 having a positive power, and f1 is a focal length of the second cylindrical lens element 32. Note that, in the optical system 30 in FIGS. 1 and 2, the image side corresponds to the +Z side, and the object side corresponds to the −Z side.

[Mathematical Formula 3]

$$t = \frac{D}{f} = 1 - s\left(\frac{1}{f_1} - \frac{1}{f}\right) \quad (3)$$

The combined focal length f of the optical system 30 is expressed by the following expression (4). Here, f2 is a focal length of the first cylindrical lens element 31.

[Mathematical Formula 4]

$$f = (f_1 f_2 / (f_1 f_2 + f_2 s - s^2))D \quad (4)$$

The expression (4) can be rearranged using the expressions (2) and (3) to produce the following expression (5).

[Mathematical Formula 5]

$$\frac{f_1 f_2}{f_1 f_2 + f_1 s - s^2} = \frac{1}{D}\frac{1}{\left(\frac{d\lambda}{dx}\right)}\sqrt{\left(\frac{1}{Nm}\right)^2 - \left(\frac{\lambda}{2}\right)^2} \quad (5)$$

By way of example, $\lambda$=970 nm, f=1128 mm, N=1600, and dx=0.225 mm are employed. The number of rulings N of the diffraction grating is set be N<4000 from a viewpoint of a manufacturing limit due to current technologies. The distance D is set be D<1500 mm from a viewpoint of an ideal size requirement. The change $d\lambda/dx$ of the resonance wavelength $\lambda$ with respect to the pitch dx is set be $d\lambda/dx<5\times10^{-7}$ from a viewpoint of current manufacturing technologies.

These numerical values can be substituted into the expression (5) to produce the following expression (6).

[Mathematical Formula 6]

$$\frac{f_1 f_2}{f_1 f_2 + f_1 s - s^2} \geq 1333.333\sqrt{\left(\frac{1}{4000m}\right)^2 - \left(\frac{\lambda}{2}\right)^2} \quad (6)$$

When the optical resonator according to the present embodiment satisfies the expression (6), the optical system 30 can be optimized. As a result, the device can be downsized even when a diffraction grating having a coarse pitch is used.

Next, specific examples of design of the optical resonator will be described below.

Comparative Example 1

Reference is made to the optical resonator illustrated in FIG. 11A.

The light source unit 110: Light beams having wavelength band of 900 nm are generated. The pitch of the laser elements is 4 mm. The design satisfies $\Delta\lambda/\Delta x=4\times10^{-7}$.

The slow axis collimator 121: The incidence plane is a flat surface. The output plane is a convex surface with a curvature radius of 25.4 mm having a power only in the Y-axis direction. Thickness is 5 mm. Material is NBK7.

The cylindrical lens 130: The incidence plane is a flat surface. The output plane is a convex surface with a curvature radius of 508.15 mm having a power only in the X-axis direction. Thickness is 3 mm. Material is NBK7.

The cylindrical lens element 151: The incidence plane is a convex surface with a curvature radius of 207.5 mm having a power only in the X-axis direction. The output plane is a flat surface. Thickness is 5 mm. Material is NBK7.

The cylindrical lens element 152: The incidence plane is a convex surface with a curvature radius of 128.31 mm having a power only in the X-axis direction. The output plane is a flat surface. Thickness is 4 mm. Material is NBK7.

The cylindrical lens element 153: The incidence plane is a flat surface. The output plane is a concave surface with a curvature radius of 5.75 mm having a power only in the X-axis direction. Thickness is 4 mm. Material is NBK7.

The diffraction grating 140: The pitch P is 1/1600 rulings/mm. The incidence angle of the principal ray from the middle laser element=49.818°. The incidence angle of the principal ray from the 4 mm upper side laser element=50.047°. The incidence angle of the principal ray from the 4 mm lower side laser element=49.589°. The diffraction angle of the principal ray=49.818° (regardless of the position of the laser element).

The resonance wavelength: 955 nm for the middle laser element. 953.4 nm for the 4 mm upper side laser element. 956.6 nm for the 4 mm lower side laser element.

The output coupler 160: Mirror material is NBK7. The incidence plane has a partially reflective coating (for example, reflectance of 2% and transmittance of 98%). The output plane has an AR coating (for example, 100% transmission).

[Distance]

The output plane of the beam twister of the light source unit 110 to the incidence plane of the slow axis collimator 121=46.57 mm.

The output plane of the slow axis collimator 121 to the incidence plane of the cylindrical lens 130=948.0272 mm.

The output plane of the cylindrical lens 130 to the diffraction grating 140=30 mm.

The diffraction grating 140 to the incidence plane of cylindrical lens element 151=28.25 mm.

The output plane of the cylindrical lens element 151 to the incidence plane of the cylindrical lens element 152=0.1 mm.

The output plane of the cylindrical lens element 152 to the incidence plane of the cylindrical lens element 153=128.31 mm.

The output plane of cylindrical lens element 153 to the incidence plane of the output coupler 160=235.91 mm.

Note that in order to concentrate the principal rays on the diffraction grating, the fast axis collimator and the beam twister are rotated by 0.00892 degrees around the optical axis.

According to this design, the dimension from the light source unit 110 to the diffraction grating 140 is about 1 m.

Example 1

Reference is made to the optical resonator illustrated in FIG. 2.

The light source unit 10: Light beams having wavelength band of 900 nm are generated. The pitch of the laser elements is 4 mm. The design satisfies $\Delta\lambda/\Delta x=4\times10^{-7}$.

The slow axis collimator 21, the diffraction grating 40, the cylindrical lens elements 51 to 53, the output coupler 60, and the resonance wavelengths of the laser elements are the same as those in comparative example 1.

The first cylindrical lens element 31: The incidence plane is a concave surface with a curvature radius of 59.971 mm having a power only in the X-axis direction. The output plane is a flat surface. Thickness is 4 mm. Material is NBK7.

The second cylindrical lens element 32: The incidence plane is a flat surface. The output plane is a convex surface with a curvature radius of 205.3319 mm having a power only in the X-axis direction. Thickness is 5 mm. Material is NBK7.

[Distance]

The output plane of the slow axis collimator 21 to the incidence plane of the first cylindrical lens element 31=123.2384 mm.

The output plane of the first cylindrical lens element 31 to the incidence plane of the second cylindrical lens element 32=329.23 mm.

The other distances are the same as those in comparative example 1.

Note that in order to concentrate the principal rays on the diffraction grating, the fast axis collimator and the beam twister are rotated by 0.035 degrees around the optical axis.

According to this design, the dimension from the light source unit 10 to the diffraction grating 40 is about 0.5 m. Incidentally, f=+970.86 mm, f1=404.10 mm, f2=−118.02 mm, and D=513.04 mm.

Comparative Example 2

Reference is made to the optical resonator illustrated in FIG. 11C.

The light source unit 210: Light beams having wavelength band of 400 nm are generated. The pitch of the laser elements is 4 mm. The design satisfies $\Delta\lambda/\Delta x=4\times10^{-7}$.

The slow axis collimator 221: The incidence plane is a flat surface. The output plane is a convex surface with a curvature radius of 26.5 mm having a power only in the Y-axis direction. Thickness is 5 mm. Material is NBK7.

The cylindrical lens 230: The incidence plane is a flat surface. The output plane is a convex surface with a curvature radius of 785.0 mm having a power only in the X-axis direction. Thickness is 3 mm. Material is NBK7.

The cylindrical lens element 251: The incidence plane is a convex surface with curvature radius of 207.5 mm having a power only in the X-axis direction. The output plane is a flat surface. Thickness is 5 mm. Material is NBK7.

The cylindrical lens element 252: The incidence plane is a convex surface with a curvature radius of 114.7 mm having a power only in the X-axis direction. The output plane is a flat surface. Thickness is 4 mm. Material is NBK7.

The cylindrical lens element 253: The incidence plane is a flat surface. The output plane is a concave surface with a curvature radius of 5.75 mm having a power only in the X-axis direction. Thickness is 4 mm. Material is NBK7.

The diffraction grating 140: The pitch P is 1/1600 rulings/mm. The incidence angle of the principal ray from the middle laser element=18.905°. The incidence angle of the principal ray from the 4 mm upper side laser element=18.905°. The incidence angle of the principal ray from the 4 mm lower side laser element=19.060°. The diffraction angle of the principal ray=18.750° (regardless of the position of the laser element).

The resonance wavelength: 405 nm for the middle laser element. 404.4 nm for the 4 mm upper side laser element. 406.6 nm for the 4 mm lower side laser element.

The output coupler 260: Mirror material is NBK7. The incidence plane has a partially reflective coating (for example, reflectance of 2% and transmittance of 98%). The output plane has an AR coating (for example, 100% transmission).

[Distance]

The output plane of the beam twister of the light source unit 210 to the incidence plane of the slow axis collimator 221=46.714 mm.

The output plane of the slow axis collimator 221 to the incidence plane of the cylindrical lens 230=1428.6466 mm.

The output plane of the cylindrical lens 230 to the diffraction grating 140=30 mm.

The diffraction grating 140 to the incidence plane of the cylindrical lens element 251=28.25 mm.

The output plane of the cylindrical lens element 251 to the incidence plane of the cylindrical lens element 252=0.1 mm.

The output plane of the cylindrical lens element 252 to the incidence plane of the cylindrical lens element 253=128.31 mm.

The output plane of the cylindrical lens element 253 to the incidence plane of the output coupler 260=235.91 mm.

Note that in order to concentrate the principal rays on the diffraction grating, the fast axis collimator and the beam twister are rotated by 0.0061 degrees around the optical axis.

According to this design, the dimension from the light source unit 110 to the diffraction grating 140 is about 1.5 m.

Example 2

Reference is made to the optical resonator illustrated in FIG. 2. However, as for the portion from the diffraction grating 40 to the output coupler 60, reference is made to FIG. 11B or FIG. 11C.

The light source unit 10: Light beams having wavelength band of 400 nm are generated. The pitch of the laser elements is 4 mm. The design satisfies $\Delta\lambda/\Delta x=4\times10^{-7}$.

The slow axis collimator 21, the diffraction grating 40, the cylindrical lens elements 51 to 53, the output coupler 60, and the resonance wavelengths of the laser elements are the same as those in comparative example 2.

The first cylindrical lens element 31: The incidence plane is a concave surface with a curvature radius of 92.504 mm having a power only in the X-axis direction. The output plane is a flat surface. Thickness is 5 mm. Material is NBK7.

The second cylindrical lens element 32: The incidence plane is a flat surface. The output plane is a convex surface with a curvature radius of 308.5 mm having a power only in the X-axis direction. Thickness is 5 mm. Material is NBK7.

[Distance]

The output plane of the slow axis collimator 21 to the incidence plane of the first cylindrical lens element 31=219.502 mm.

The output plane of the first cylindrical lens element 31 to the incidence plane of the second cylindrical lens element 32=469.42 mm.

The other distances are the same as those in comparative example 2.

Note that in order to concentrate the principal rays on the diffraction grating, the fast axis collimator and the beam twister are rotated by 0.0229 degrees around the optical axis.

According to this design, the dimension from the light source unit 10 to the diffraction grating 40 is about 0.8 m. Incidentally, f=1485.09 mm, f1=582.08 mm, f2=−174.54 mm, and D=750.64 mm.

In the optical resonator 1 according to the present embodiment, the plurality of laser elements 11a may generate light beams having the wavelength band of 400 nm.

Thus, light beams having wavelengths shorter than the wavelength band of 900 nm can be generated.

Third Embodiment

Figure 13:
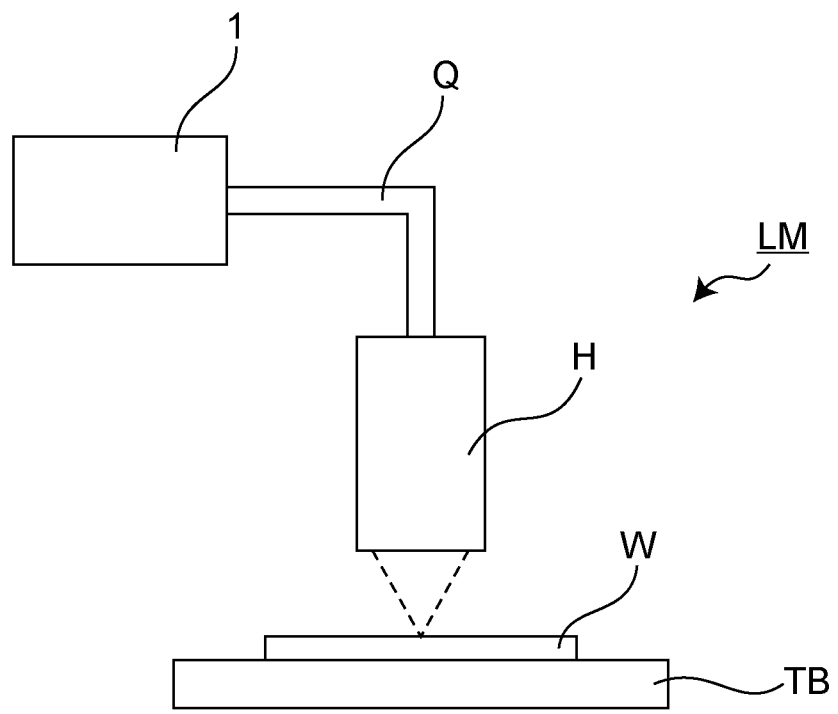
FIG. 13 is a block diagram illustrating an example of a laser processing apparatus according to the present disclosure.

Hereinafter, a third embodiment of the present disclosure will be described below with reference to FIG. 13. FIG. 13 is a block diagram illustrating an example of a laser processing apparatus according to the present disclosure. A laser processing apparatus LM includes such an optical resonator 1 as disclosed in the first and second embodiments, a transmission optical system Q that transmits a light beam output from the optical resonator 1, a processing head H that irradiates a workpiece W with the light beam, a table TB that holds the workpiece W and three-dimensionally positions the workpiece W with respect to a focal spot of the light beam, and the like. The laser processing apparatus LM is capable of laser cutting, laser drilling, laser welding, laser marking, laser annealing, and the like.

The laser processing apparatus LM according to the present embodiment can be downsized by employing the optical resonator 1 according to the first and second embodiments.

Other Embodiments

As described above, the first to third embodiments have been described to exemplify the technology disclosed in the present application. The technology of the present disclosure, however, is not limited only to these embodiments, but also can be applied to other embodiments appropriately devised through modification, substitution, addition, omission and so on. Further, a new embodiment can be obtained by combining the respective components described in the above embodiments. Thus, another embodiment will be exemplified below.

In the above embodiments, a single lense have been exemplified for the collimators, the lenses, and the lens elements. Alternatively, a lens group or a compound lens with a plurality of lenses combined may be used.

As described above, the embodiments have been described to disclose the technology in the present disclosure. To that end, the accompanying drawings and detailed description are provided.

Therefore, among the components described in the accompanying drawings and the detailed description, not only the components that are essential for solving the problem, but also the components that are not essential for solving the problem may also be included in order to exemplify the above-described technology. Therefore, it should not be directly appreciated that the above non-essential components are essential based on the fact that the non-essential components are described in the accompanying drawings and the detailed description.

Further, the above-described embodiments have been described to exemplify the technology in the present disclosure. Thus, various modification, substitution, addition, omission and so on can be made within the scope of the claims or equivalents thereof.

INDUSTRIAL APPLICABILITY

The present disclosure can be applied to light sources or the like that generates light beams. In particular, the present disclosure can be applied to laser processing, for example, laser cutting, laser drilling, laser welding, laser marking, and laser annealing.

The invention claimed is:

1. An optical resonator of wavelength beam combining type that combines a plurality of light beams having different wavelengths, including:
   a laser diode array having a plurality of laser elements arranged along a predetermined direction and configured to emit light beams having wavelengths different from one another;
   a diffraction grating that diffracts the light beam emitted from each of the laser elements at a diffraction angle corresponding to the wavelength of the light beam;
   an output coupler that reflects a part of the light beam diffracted by the diffraction grating toward each of the laser elements; and
   an optical system provided between the laser diode array and the diffraction grating and configured to align the light beams emitted from the laser elements with one another;
   wherein the optical system includes, in a sequence from the laser diode array toward the diffraction grating, a first lens element having a negative power only in the predetermined direction and a second lens element having a positive power only in the predetermined direction, and
   wherein the optical resonator satisfies the following expression:

$$\frac{f_1 f_2}{f_1 f_2 + f_1 s - s^2} \geq 1333.333 \sqrt{\left(\frac{1}{4000m}\right)^2 - \left(\frac{\lambda}{2}\right)^2}$$

where, f1 is a focal length of the second lens element, f2 is a focal length of the first lens element, s is a distance from an object-side principal plane of the first lens element to an image-side principal plane of the second lens element, m is a diffraction order of the diffraction grating, and λ is a resonance wavelength.

2. The optical resonator according to claim 1, wherein the optical system has a focal length longer than a distance between the laser diode array and the second lens element.

3. The optical resonator according to claim 1, further including in a sequence from the laser diode array toward the diffraction grating;
- a fast axis collimator that collimates in a fast direction each of the light beams emitted from the respective laser elements,
- a beam twister that rotates each of the light beams output from the fast axis collimator by 90 degrees around a principal ray thereof, and
- a slow axis collimator that collimates in a slow direction each of the light beams output from the beam twister;
- wherein a focal position of the optical system is set in a vicinity of the output plane of the beam twister.

4. The optical resonator according to claim 1, wherein the plurality of laser elements generate light beams at the wavelength band of 400 nm.

5. A laser processing apparatus comprising:
the optical resonator according to claim 1, and
a processing head that irradiates a workpiece with the light beam output from the optical resonator.

6. An optical resonator of wavelength beam combining type that combines a plurality of light beams having different wavelengths, including:
- a laser diode array having a plurality of laser elements arranged along a predetermined direction and configured to emit light beams having wavelengths different from one another;
- a diffraction grating that diffracts the light beam emitted from each of the laser elements at a diffraction angle corresponding to the wavelength of the light beam, the diffraction grating having a number of rulings less than 4,000;
- an output coupler that reflects a part of the light beam diffracted by the diffraction grating toward each of the laser elements; and
- an optical system provided between the laser diode array and the diffraction grating and configured to align the light beams emitted from the laser elements with one another;

wherein the optical system includes, in a sequence from the laser diode array toward the diffraction grating, a first lens element having a negative power only in the predetermined direction and a second lens element having a positive power only in the predetermined direction, and wherein a distance from an image-side principal plane of the second lens element to a focal plane on an object side of the optical system is less than 1500 mm, and wherein the optical system has a focal length longer than a distance between the laser diode array and the second lens element.

7. The optical resonator according to claim 6, wherein a change of a resonance wavelength with respect to a pitch of the plurality of laser elements is less than 5×10-7.

8. The optical resonator according to claim 6, satisfying the following expression:

$$\frac{f_1 f_2}{f_1 f_2 + f_1 s - s^3} \geq 1333.333 \sqrt{\left(\frac{1}{4000 \text{ m}}\right)^2 - \left(\frac{\lambda}{2}\right)^2}$$

where, f1 is a focal length of the second lens element, f2 is a focal length of the first lens element, s is a distance from an object-side principal plane of the first lens element to an image-side principal plane of the second lens element, m is a diffraction order of the diffraction grating, and λ is a resonance wavelength.

9. The optical resonator according to claim 6, further including in a sequence from the laser diode array toward the diffraction grating;
- a fast axis collimator that collimates in a fast direction each of the light beams emitted from the respective laser elements,
- a beam twister that rotates each of the light beams output from the fast axis collimator by 90 degrees around a principal ray thereof, and
- a slow axis collimator that collimates in a slow direction each of the light beams output from the beam twister;
- wherein a focal position of the optical system is set in a vicinity of the output plane of the beam twister.

10. The optical resonator according to claim 6, wherein the plurality of laser elements generate light beams at the wavelength band of 400 nm.

11. A laser processing apparatus comprising:
the optical resonator according to claim 6, and
a processing head that irradiates a workpiece with the light beam output from the optical resonator.

* * * * *